(12) United States Patent
Moriyama

(10) Patent No.: US 6,348,417 B1
(45) Date of Patent: Feb. 19, 2002

(54) SEMICONDUCTOR DEVICE MANUFACTURING APPARATUS AND SEMICONDUCTOR DEVICE MANUFACTURING METHOD

(75) Inventor: Tsuyoshi Moriyama, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/671,030

(22) Filed: Sep. 27, 2000

Related U.S. Application Data

(62) Division of application No. 09/282,489, filed on Mar. 31, 1999.

(30) Foreign Application Priority Data

Apr. 3, 1998 (JP) .............................. 10-108628

(51) Int. Cl.⁷ .................. H01L 21/00; C23C 16/00; H05H 1/00
(52) U.S. Cl. .................. 438/706; 118/719; 118/724; 118/715; 156/345
(58) Field of Search ................. 438/706, 715, 438/716; 118/724, 715, 719, 725, 729; 156/345

(56) References Cited

U.S. PATENT DOCUMENTS

| 5,279,670 A | 1/1994 | Watanabe et al. |
| 5,320,680 A | 6/1994 | Learn et al. |
| 5,380,399 A | 1/1995 | Miyashita et al. |
| 5,484,484 A | 1/1996 | Yamaga et al. |
| 5,503,875 A | 4/1996 | Imai et al. |
| 5,554,226 A | 9/1996 | Okase et al. |
| 5,560,777 A | 10/1996 | Ahn |
| 5,601,651 A | 2/1997 | Watabe |
| 5,622,566 A | 4/1997 | Hosaka et al. |
| 5,633,211 A | 5/1997 | Imai et al. |
| 5,648,114 A | 7/1997 | Paz De Araujo et al. |
| 5,650,361 A | 7/1997 | Radhakrishnan |
| 5,672,252 A | 9/1997 | Hayashi et al. |
| 5,683,517 A | 11/1997 | Shan |
| 5,738,721 A | 4/1998 | Barron et al. |
| 5,800,616 A | 9/1998 | Persyn |
| 5,814,153 A | 9/1998 | Ishikawa |

FOREIGN PATENT DOCUMENTS

| EP | 0410442 | 1/1991 |
| EP | 0 454 054 | 10/1991 |
| EP | 0 474 140 | 3/1992 |
| EP | 0 614 216 | 9/1994 |
| EP | 0 635 877 | 1/1995 |
| EP | 0 883 166 | 12/1998 |
| GB | 2202236 | 9/1988 |
| GB | 2261444 | 5/1993 |
| GB | 2273391 | 6/1994 |
| GB | 2273605 | 6/1994 |
| GB | 2282825 | 4/1995 |
| GB | 2 298 087 | 8/1996 |
| GB | 2 298 736 | 9/1996 |
| JP | 58-81437 | 5/1983 |
| JP | 1-162329 | 6/1989 |
| JP | 3207865 | 9/1991 |
| JP | 4132225 | 5/1992 |
| JP | 4-308086 | 10/1992 |
| JP | 5226345 | 9/1993 |
| JP | 8008195 | 1/1996 |
| JP | 8-115883 | 5/1996 |
| WO | WO 97/22992 | 6/1997 |
| WO | WO 98/38674 | 9/1998 |

Primary Examiner—Gregory Mills
Assistant Examiner—P. Hassanzadeh

(57) ABSTRACT

In a semiconductor device manufacturing apparatus and a semiconductor device manufacturing method, a furnace tube port gas introducing pipe (9) for supplying gas to only one end portion of a furnace tube (2) is provided separately from a process gas introducing pipe (5) for supplying process gas into the furnace tube (2), and when wafers (4) are inserted into the furnace tube (2), an oxygen atmospheric layer (11) is formed only at the furnace tube port by oxygen gas or oxygen gas diluted with nitrogen gas which is supplied from the furnace tube port gas introducing pipe (9).

7 Claims, 8 Drawing Sheets

F I G. 4
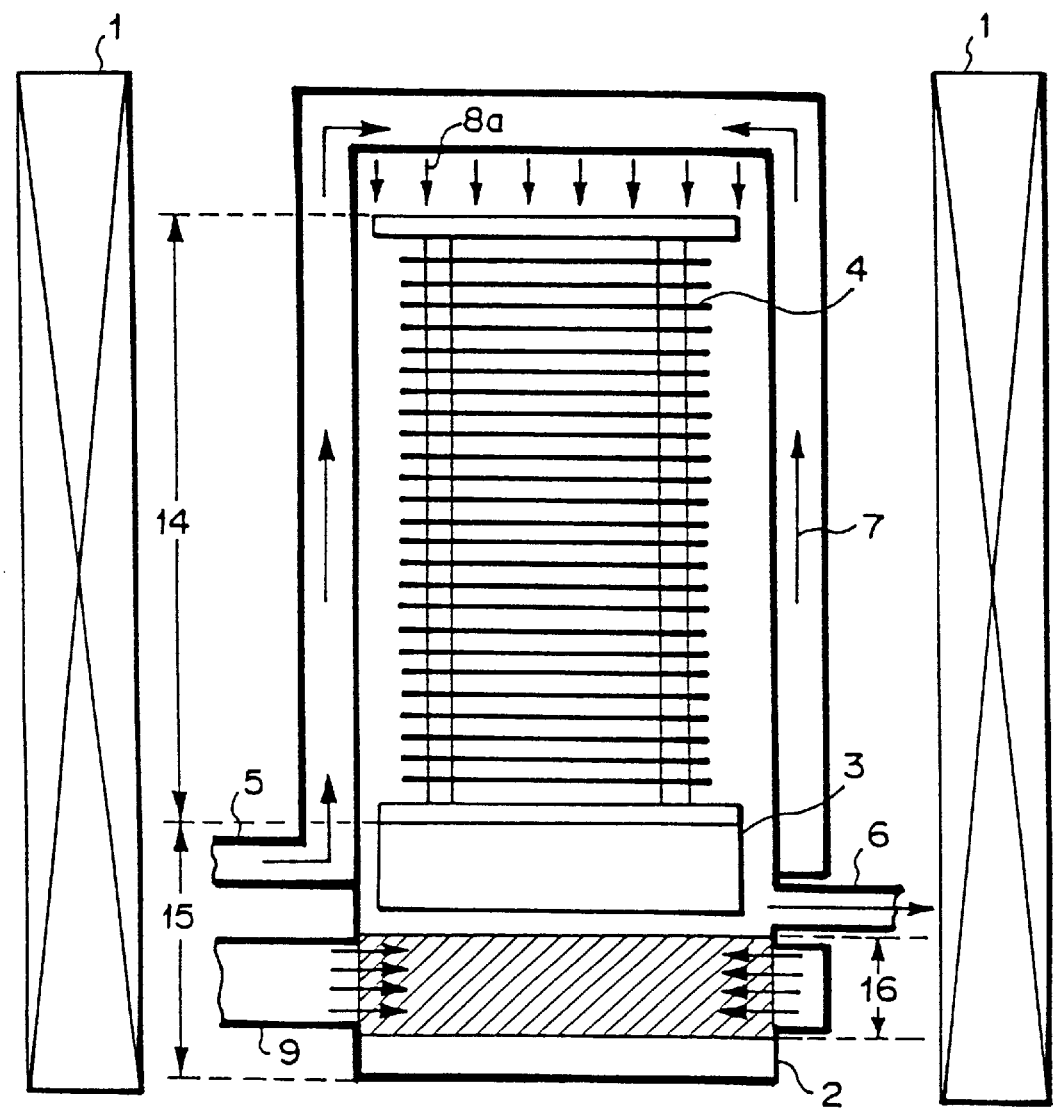

SEMICONDUCTOR DEVICE MANUFACTURING APPARATUS AND SEMICONDUCTOR DEVICE MANUFACTURING METHOD

CROSS-REFERENCE TO RELATED APPLICATION

This application is a division of application Ser. No. 09/282,489 filed Mar. 31, 1999 and allowed.

BACKGROUND OF THE INVENTION

1. Field of the Invention

The present invention relates to a semiconductor device manufacturing apparatus and a semiconductor device manufacturing method, and particularly to a diffusion furnace used in a diffusion process and an oxide film forming method using the diffusion furnace.

2. Description of the Related Art

A conventional diffusion furnace and an oxide film forming method using the diffusion furnace will be described. FIG. 1 is a longitudinal-sectional view showing a vertical type diffusion furnace to describe a conventional technique, and FIG. 2 is a diagram showing an oxidation treatment sequence of the conventional diffusion furnace. The vertical type diffusion furnace shown in FIG. 1 includes a furnace tube 2 to which a process gas introducing pipe 5 and a gas discharging pipe 6 are secured, a wafer support boat 3 for mounting wafers 4 thereon, and a heater 1 for keeping the inside of the furnace tube 2 to a desired temperature.

Referring to FIGS. 1 and 2, steps until the oxidation treatment carried out in the vertical type diffusion furnace will be described.

First, wafers 4 are introduced into the furnace tube 2 (first step). At this time, oxygen gas of 2 [SLM] diluted with nitrogen gas of 18 [SLM] is introduced as process gas into the furnace tube 2, and the inside of the furnace tube 2 is kept at 800° C. by a heater 1, for example.

Subsequently, temperature stabilization (Recovery) in the furnace tube 2 after the wafers 4 are introduced is promoted (second step), and then the temperature increase to an oxidation treatment temperature, for example, 850° C. (Ramp-up) (third step) and the temperature stabilization after the increase of the temperature (Ramp Recovery) (fourth step) are carried out. Here, the gas conditions from the second step to the fourth step are the same as the first step.

In a fifth step, steam gas of 15 [SLM] is supplied as process gas to perform oxidation treatment (Burning), thereby obtaining the final oxide film thickness.

The thickness of the oxide film which has been formed until the time just before the fifth step (oxidation treatment step) is equal to 3.5 nm on the average, and the in-batch film thickness uniformity is equal to 5%. Further, the thickness of the oxide film which has been formed until the time just after the first step is completed is equal to 2.5 nm on the average. The in-batch film thickness uniformity is equal to 8%.

Here, the in-batch film thickness uniformity is defined as a value calculated according to the following equation:

"in-batch film thickness uniformity"=(in-batch maximum difference of film thickness average values of respective wafers)× 100/(2×the in-batch average value of film thickness average values of respective wafers)

Further, the film thickness average value of each wafer represents the average value of film thickness values at five points on the wafer surface (the center point of the wafer and four peripheral points which are located on a cross passing the wafer center point and spaced from the wafer edge by 5 mm).

The thickness of the oxide film formed on the wafer 4 before the oxidation treatment step is determined by the exposure time for which the wafers 4 are exposed to oxygen atmosphere in the furnace tube 2, the oxygen concentration in the furnace tube 2, the temperature in the furnace tube 2, etc.

Here, with respect to the conventional diffusion furnace, since oxygen atmospheric layer has been formed entirely in the furnace tube 2 when the wafers 4 are introduced into the furnace tube 2, wafers located at the top and bottom sides of the wafer support boat 3 are exposed to oxygen atmosphere for different times, respectively (that is, the exposure time is different between the wafer located at the top side and the wafer located at the bottom side). Accordingly, the thickness of the oxide film formed before the oxidation treatment step is larger at the top side than at the bottom side, so that the in-batch film thickness uniformity is lowered.

SUMMARY OF THE INVENTION

The present invention has been implemented in view of the foregoing problem, and has an object to a semiconductor device manufacturing apparatus and a semiconductor device manufacturing method which can form an oxide film uniformly in a batch of wafer when the oxide film is formed on a wafer mounted in each part of a wafer support boat which is inserted in a furnace tube.

In order to attain the above object, according to a semiconductor device manufacturing apparatus of the present invention, a furnace tube port gas introducing pipe (port) for supplying desired gas is provided at only one end of the furnace tube, and when a treating target of semiconductor wafer such as silicon wafer is put into the furnace tube, an atmospheric layer of one or more kinds of desired gas is formed only at the port of the furnace tube by the desired reactive gas such as oxidative gas supplied from the furnace tube port gas introducing pipe. More specifically, the semiconductor device manufacturing apparatus of the present invention has the following feature.

According to one aspect of the present invention, a member to be treated or treating target is inserted into the furnace tube from one end of the furnace tube, and when the member to be treated is inserted, gas containing at least reactive gas is introduced into the furnace tube from a gas introducing port disposed near to the one end of the furnace tube to thereby supply the gas to the member to be treated while gas containing at least non-reactive gas is supplied into the furnace tube from another gas introducing port.

Further, according to the present invention, in a semiconductor device manufacturing method using a semiconductor device manufacturing apparatus in which a batch of plural semiconductor substrates serving as treatment targets are inserted into a furnace tube to perform the treatment such as oxidation on the substrates, in a process of inserting the batch of the plural semiconductor substrates serving as the treatment targets from an insertion port at one end of the furnace tube into the furnace tube, gas containing at least reactive gas is introduced into the furnace tube through a gas introducing port disposed near to the one end of the furnace tube in the direction substantially perpendicular to the batch insertion direction, thereby forming a gas atmosphere having a layer boundary in the direction substantially perpendicular to the batch insertion direction, and gas containing at least non-reactive gas is introduced through another gas introducing port of the furnace tube at the opposite end to the one end of the furnace tube, thereby making uniform in thickness the films formed on the plural substrates serving as the treatment targets under the gas atmosphere in the batch.

The present invention provides a semiconductor device manufacturing apparatus for performing a surface treatment of a semiconductor substrate, comprising:

a furnace tube having a port at one end thereof;

a heating means for the furnace tube;

a semiconductor substrate support means for inserting the semiconductor substrate into the furnace tube through the port of the furnace tube;

a first gas introducing port for introducing a reactive gas for the surface treatment into a first area of the inside of the furnace tube near to the port of the furnace tube; and a second gas introducing port for introducing a non-reactive gas to the semiconductor substrate into a second area of the inside of the furnace tube at the other end side of the furnace tube, wherein the semiconductor substrate is moved to the second area by means of the semiconductor substrate support means.

The first gas introducing port may be disposed at a lateral surface of the furnace tube. The semiconductor substrate support means may support the semiconductor substrate perpendicularly to the insertion direction of the semiconductor substrate.

The first gas introducing port may have a first portion for introducing the reactive gas into the first area and a second portion for introducing a non-reactive gas to the semiconductor substrate into a third area of the inside of the furnace positioning the opposite side of the first area to the second area. The first gas introducing port may be divided into a plurality of divided portions relative to the insertion direction of the semiconductor substrate, and the reactive gas may be introduced into the first area through at least a part of the plurality of divided portions.

The second gas introducing port may be disposed at the other end of the furnace tube. The second gas introducing port may be also for use in introducing a reactive gas for the surface treatment.

The semiconductor substrate may be a silicon wafer, and the surface treatment may be an oxidation treatment of the surface of the silicon wafer. The reactive gas being introduced into the first area of the inside of the furnace tube from the first gas introducing port may be an oxygen gas diluted with one of a nitrogen gas and inert gas, and the non-reactive gas being introduced into the second area of the inside of the furnace tube from the second gas introducing port may be one of a nitrogen gas and inert gas.

The present invention also provides a method of manufacturing a semiconductor device for performing a surface treatment of a semiconductor substrate, wherein the following processes are simultaneously performed:

(a) a first process for inserting the semiconductor substrate at a fixed speed into a furnace tube through a port of the furnace tube at one end thereof;

(b) a second process for introducing a reactive gas for the surface treatment into a first area of the inside of the furnace tube near to the port of the furnace tube; and (c) a third process for introducing a non-reactive gas to the semiconductor substrate into a second area of the inside of the furnace tube at the other end side of the furnace tube, wherein the semiconductor substrate is moved to the second area in the first process.

A reactive gas for the surface treatment may be introduced into the second area of the inside of the furnace tube after the semiconductor substrate is moved to the second area.

According to the present invention, the following effects can be obtained.

A first effect according to the present invention resides in that the thickness of the film formed under the gas atmosphere can be made uniform in batch of the wafers. The reason is as follows.

When the wafers are inserted into the furnace tube, the thickness of the film formed on each wafer is determined by the exposure time of the wafer to the gas atmosphere in the furnace tube if the other conditions are fixed. Therefore, according to the present invention, the gas atmospheric layer is formed only in the furnace tube port while the inert gas is filled in the furnace tube process portion, whereby no film is formed in the furnace tube process portion until the wafers are completely inserted into the furnace tube.

Accordingly, if the insertion speed of the wafer support boat into the furnace tube is kept constant, the passing time of the wafers through the gas atmospheric layer at the furnace tube port is equal both at the top side and at the bottom side of the batch of the wafers, and the films can be formed to have a uniform thickness in the batch.

A second effect of the present invention resides in that the thickness of the film formed under the gas atmosphere can be easily varied. The reason is as follows.

When the wafers are inserted into the furnace tube, the thickness of the films formed is determined by the width of the film forming gas atmospheric layer in the furnace tube port if the other conditions are fixed. Therefore, according to the present invention, the furnace tube port gas introducing pipe can be separated into plural parts, and the width of the gas atmospheric layer can be varied by selecting the boundary position between the parts of the furnace tube port gas introducing pipes to be used for forming the film forming gas atmospheric layer and not to be used therefor.

BRIEF DESCRIPTION OF THE DRAWINGS

FIG. 4 is a longitudinal-sectional view showing the diffusion furnace of the first embodiment of the present invention (a state where the insertion of the wafers is completed);

DETAILED DESCRIPTION OF THE PREFERRED EMBODIMENTS

Figure 1:
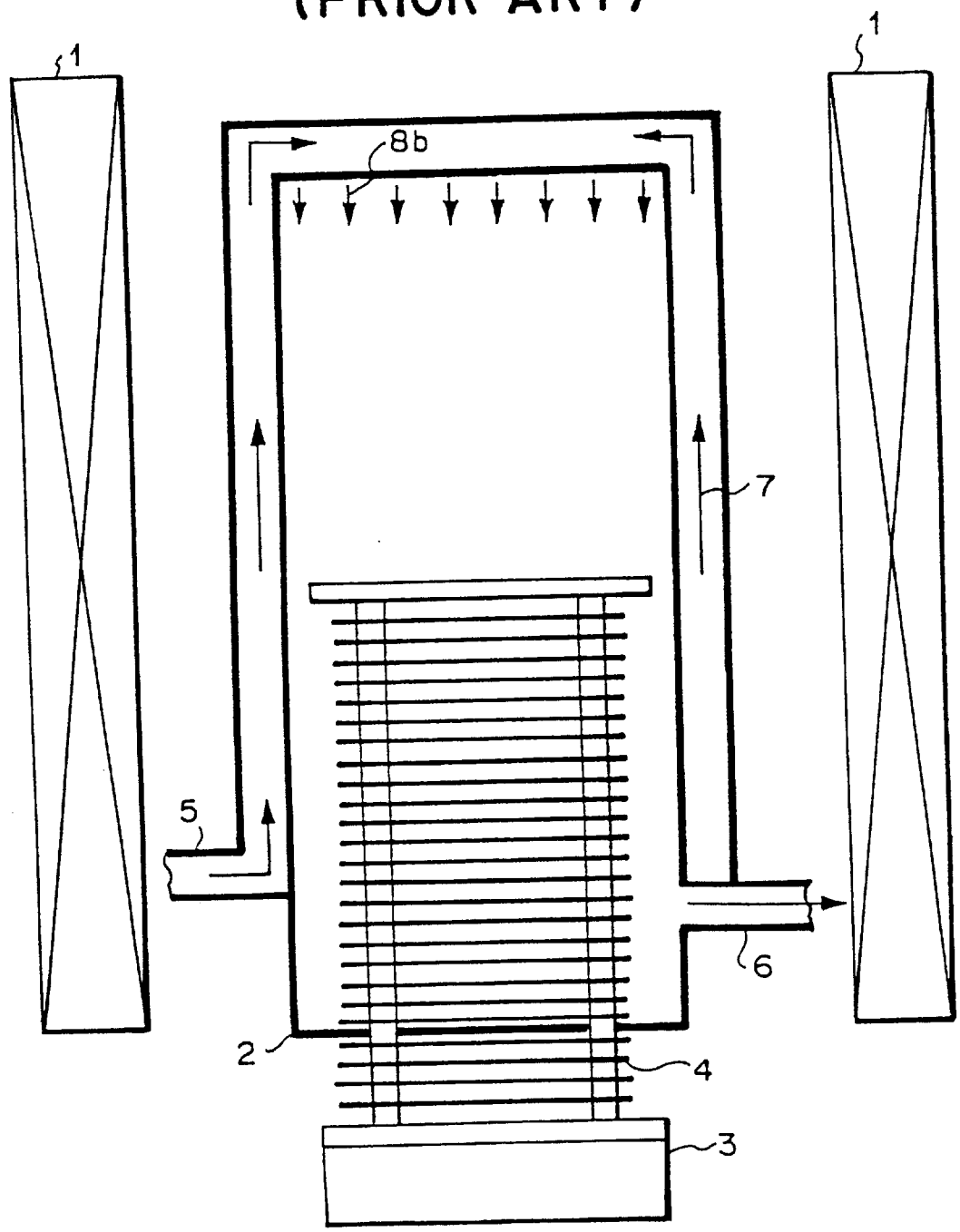
FIG. 1 is a longitudinal-sectional view showing a diffusion furnace of a prior art (during an insertion process of wafers)
Figure 2:
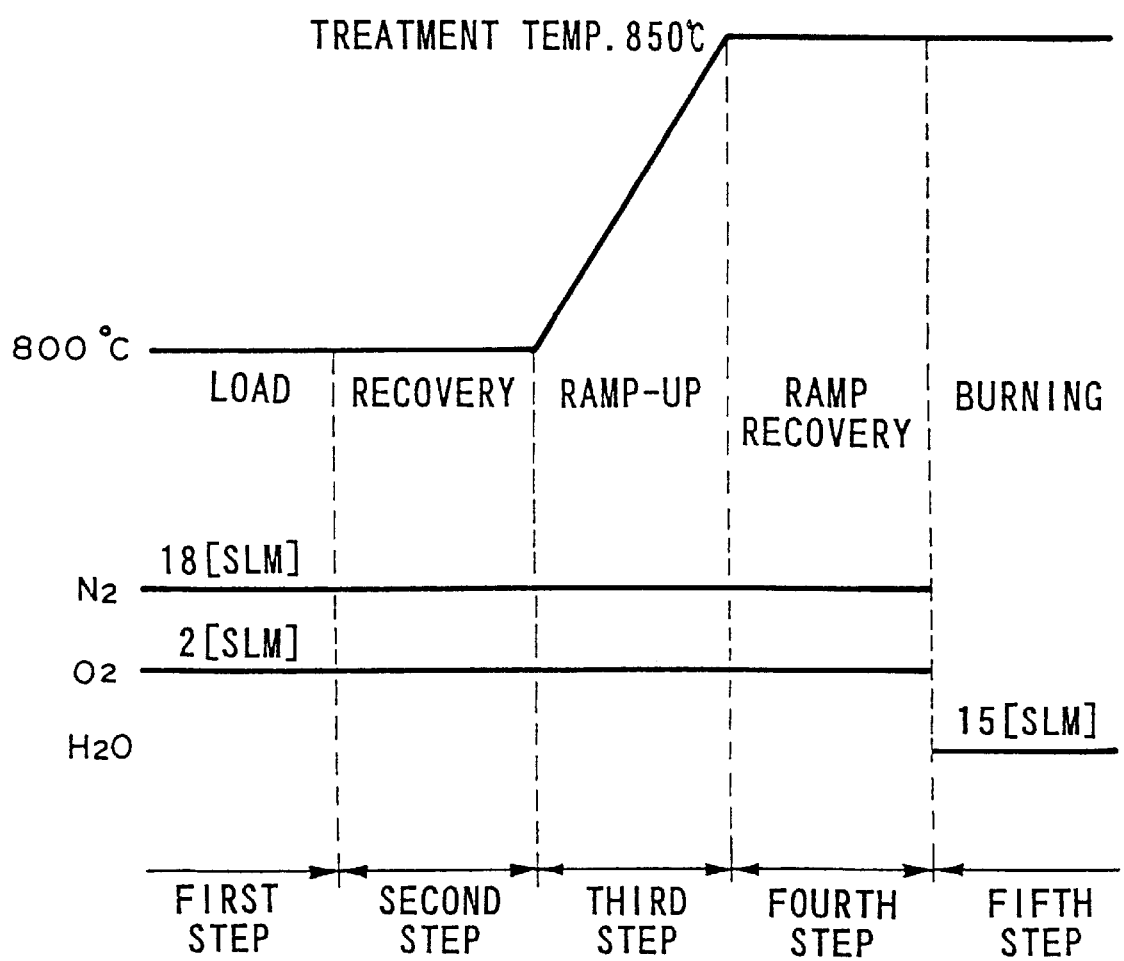
FIG. 2 is a sequence diagram showing an oxidation treatment in the diffusion furnace of the prior art.

Preferred embodiments according to the present invention will be described hereunder with reference to the accompanying drawings.

According to the present invention, in a semiconductor device manufacturing apparatus which includes a furnace tube (reference numeral 2 in FIG. 3) the inside of which is filled with gas, a heater (reference numeral 1 in FIG. 3) for keeping the inside temperature of the furnace tube to a desired temperature and a process gas introducing pipe for supplying gas into the furnace tube (reference numeral 5 in FIG. 3) and into which wafers (reference numeral 4 in FIG. 3) mounted on a wafer support boat (reference numeral 3 in FIG. 3) are inserted from one opening end portion (port) of the furnace tube, a furnace tube port gas introducing pipe (reference numeral 9 in FIG. 3) is provided to the one end portion of the furnace tube.

[First Embodiment]

Figure 3:
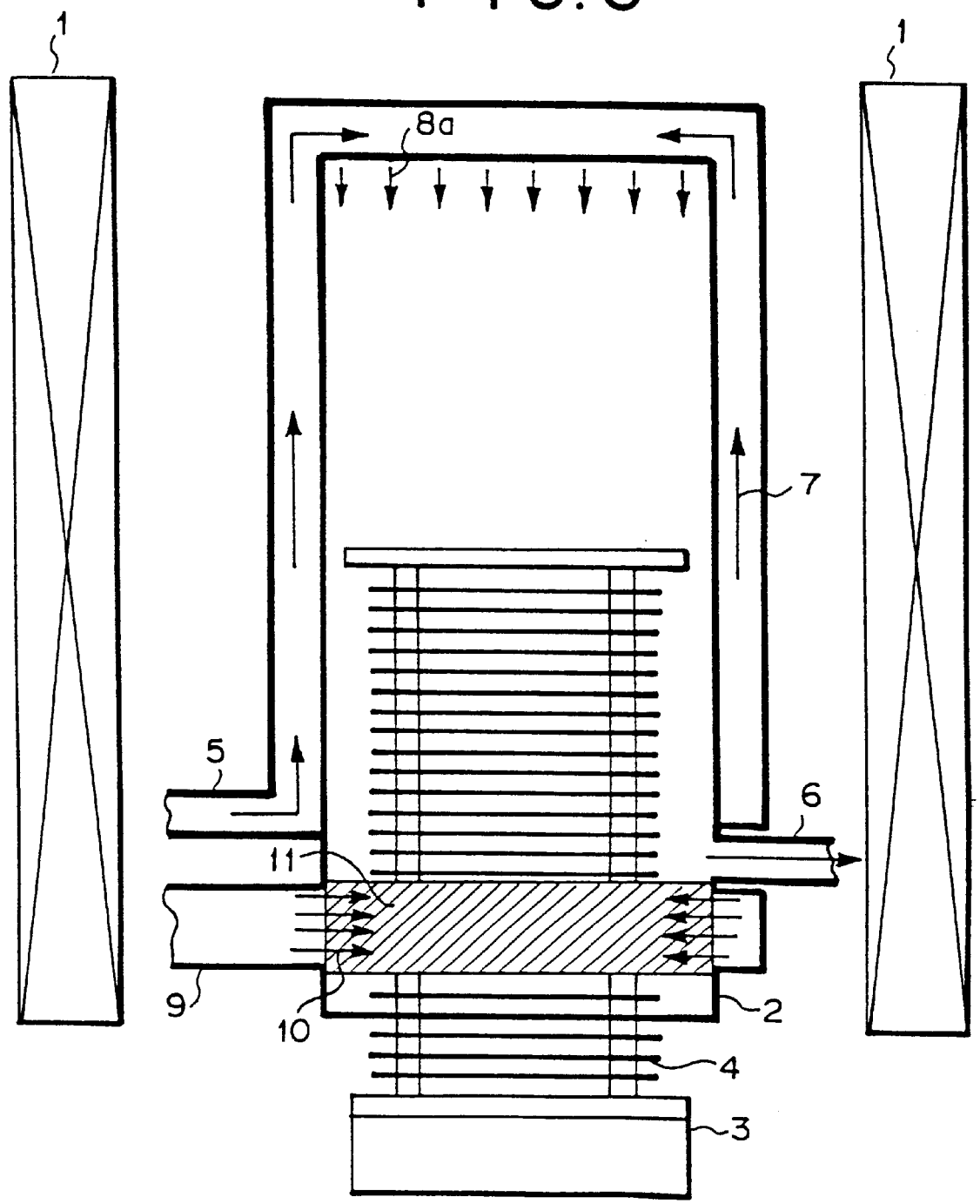
FIG. 3 is a longitudinal-sectional view of a diffusion furnace according to a first embodiment of the present invention (during an insertion process of wafers)
Figure 5:
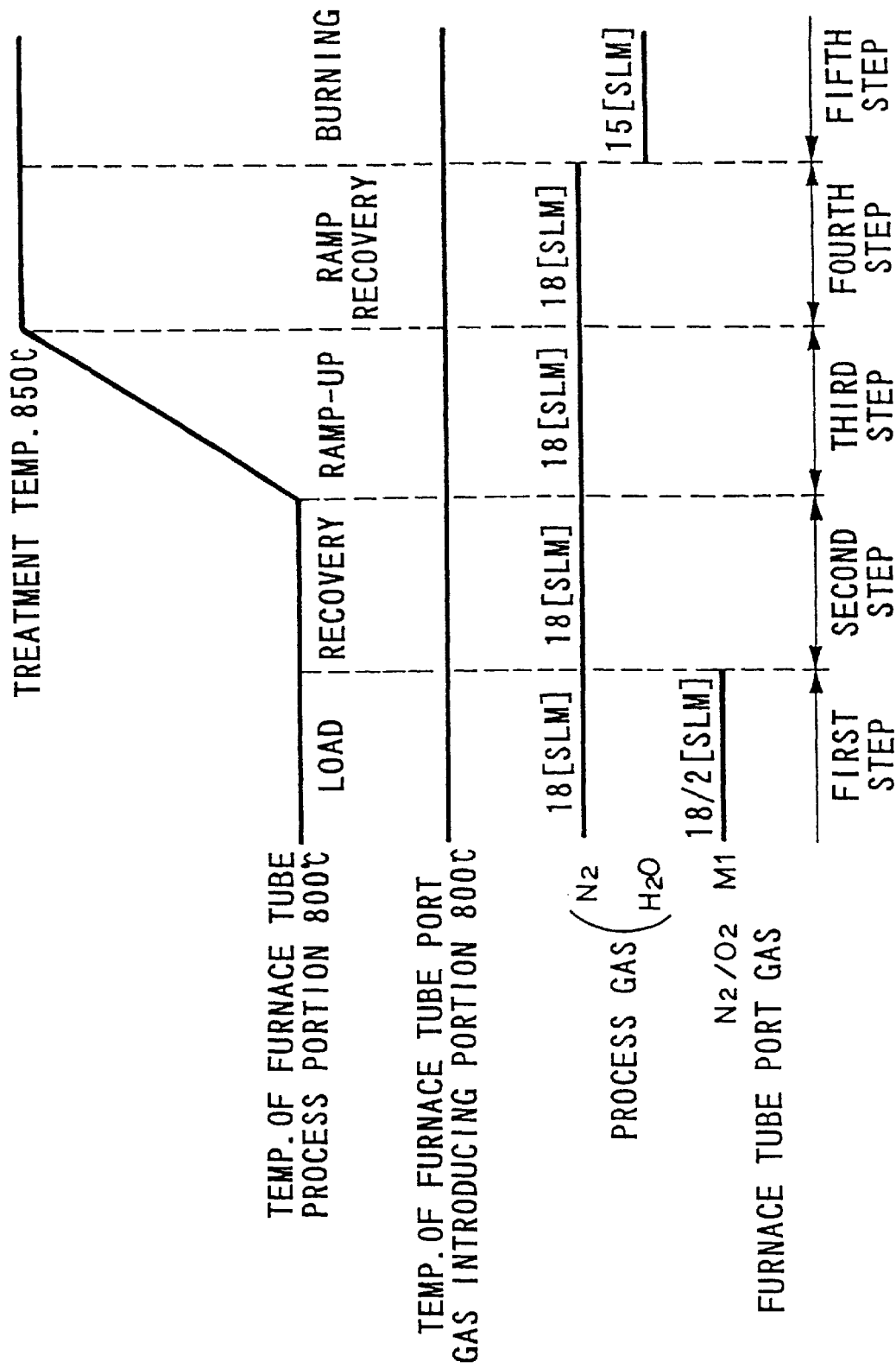
FIG. 5 is a sequence diagram showing an oxidation treatment in the diffusion furnace of the first embodiment of the present invention.

A first embodiment according to the present invention will be described with reference to FIGS. 3 to 5. FIGS. 3 and 4 are longitudinal-sectional views showing the construction of the first embodiment of the semiconductor device manufacturing apparatus of the present invention. More specifically, FIG. 3 shows a state where a batch of semiconductor wafers are being inserted into the furnace tube 2, and FIG. 4 shows a state after the batch of semiconductor wafers are completely inserted. FIG. 5 is a diagram showing a temperature sequence of the first embodiment according to the present invention.

Referring to FIGS. 3 and 4, in this embodiment, the present invention is applied to a vertical type diffusion furnace including a process gas introducing pipe 5, a furnace tube 2 provided with a furnace tube port gas introducing pipe 9 and a gas discharge pipe 6, a wafer support boat 3 on which wafers 4 are mounted horizontally and a heater 1 for keeping the inside of the furnace tube 2 to a desired temperature.

The furnace tube port gas introducing pipe 9 has a gas supply mechanism for supplying gas to a furnace tube port gas supply portion 16 at a furnace tube port 15 in the direction parallel to the wafers 4 (horizontally), whereby an atmospheric layer different from that of a furnace tube process portion 14 is formed in the furnace tube port gas supply portion 15.

Here, as shown in FIG. 4, the furnace tube process portion 14 is defined as an area inside the furnace tube which corresponds to the wafer mountable range of the wafer support boat 3 in the state where the wafer support boat 3 having the wafers 4 mounted thereon is perfectly accommodated in the furnace tube 2. In other words, the furnace tube process portion 14 means an oxidation treatment area for the wafers 4 with process gas.

The furnace tube port 15 means an area inside the furnace tube which extends from the lowermost end of the furnace tube process portion 14 to the lowermost end of the furnace tube 2 in the furnace tube, and the furnace tube port gas supply portion 16 means an area in which the gas atmosphere formed by the gas supplied from the furnace tube port gas introducing pipe 9 at the furnace tube port 15 exists.

The inside temperature of the furnace tube 2 is controlled by the heater 1 so that the inside temperature can be set to be different between the furnace tube process portion 14 and the furnace tube port gas supply portion 16. Nitrogen gas containing steam gas as oxidative gas, or nitrogen gas is used as the process gas, and the process gas is passed through the process gas introducing pipe 5 and then supplied from the upper portion of the furnace tube 2 into the furnace tube 2. Accordingly, the process gas stream 8a in the furnace tube 2 is directed from the upper portion of the furnace tube 2 to the lower portion of the furnace tube 2.

Further, oxygen gas and nitrogen gas supplied into the furnace tube 2 from the furnace tube port gas introducing pipe 9 are blown out horizontally in the direction parallel to the wafers 4, thereby forming the furnace tube port gas supply portion 16. The boundary of the gas atmosphere in the furnace tube port gas supply portion 16 or the interface between the gas atmosphere in the furnace tube port gas supply portion 16 and the process gas atmosphere in the furnace tube 2 is horizontal, i.e. parallel to the wafers 4.

Next, the oxidation treatment sequence in the first embodiment of the present invention will be described with reference to the sequence diagram of FIG. 5.

In a first step, the wafer support boat 3 having the wafers such as silicon wafers mounted thereon is inserted into the furnace tube 2 upwardly. At this time, the temperature of the furnace tube process portion 14 and the furnace tube port gas supply portion 16 is kept, for example, to 800° C. by the heater 1.

Here, nitrogen ($N_2$) gas of 18 [SLM] is supplied as the process gas, and mixture gas of oxygen ($O_2$) gas of 2 [SLM] and nitrogen gas of 18 [SLM] is supplied as the gas with which the furnace tube port gas supply portion 16 is formed.

When the wafer support boat 3 is inserted into the furnace tube 2, the insertion speed of the wafer support boat 3 is kept at a fixed rate of 100 mm/minute while the wafers 4 are passed through the furnace tube port gas supply portion 16. In this step, a state where the wafer support boat 3 is being inserted into the furnace tube is shown in FIG. 3, and a state where the insertion of the wafer support boat 3 is completed is shown in FIG. 4.

In a second step, temperature stabilization (Recovery) after the wafer support boat is inserted into the furnace tube is carried out. At this time, no mixture gas of oxygen gas and nitrogen gas is supplied to the furnace tube port gas supply portion 16. The other process gas condition and temperature condition are the same as the first step.

The increase of temperature to the oxidation treatment temperature of 850° C. (Ramp-up) in a third step, the temperature stabilization (Ramp Recovery) after the temperature increase in a fourth step and the oxidation treatment (Burning) in a fifth step are carried out. In the oxidation treatment (Burning), steam ($H_2O$) gas of 15 [SLM] is supplied as the process gas in place of nitrogen gas, thereby obtaining the final oxide film thickness.

The thickness of the oxide film such as silicon oxide film which is formed on the wafers 4 when the wafers 4 are inserted into the furnace tube is determined by an exposure time for which the wafers 4 are exposed to the oxygen atmosphere in the furnace tube, the oxygen concentration in the furnace tube, the temperature in the furnace tube, etc. In the conventional technique, since the temperature in the furnace tube is controlled to a fixed value and the oxygen concentration in the furnace tube is expected to be substantially fixed over the area from the upper portion to the lower portion of the furnace tube, the film thickness uniformity in the batch of the wafers is dependent on the exposure time for which the wafers are exposed to the oxygen atmosphere in the furnace tube 2.

In this embodiment, since the oxygen atmospheric layer 11 is formed at only the furnace tube port 15, and the furnace tube process portion 14 is filled with nitrogen gas, no oxide film is formed in the furnace tube process portion 14. Accordingly, if the insertion speed of the wafer support boat 3 into the furnace tube 2 is constant, the exposure time for which the wafers are exposed to the oxygen atmospheric layer 11 are invariable between the wafers at the top side and the wafers at the bottom side, and thus the oxide film can be formed to be uniform in the batch of the wafers.

In this embodiment, the thickness of the oxide film which has been formed until the time just before the fifth step (oxidation treatment step) is equal to 1.5 nm, and the in-batch film thickness uniformity at this time is equal to 3%, so that the film formation can be performed with high uniformity.

Here, the in-batch film thickness uniformity is defined as a value calculated according to the following equation:

"in-batch film thickness uniformity"=(in-batch maximum difference of film thickness average values of respective wafers)× 100/(2×the in-batch average value of film thickness average values of respective wafers)

Further, the film thickness average value of each wafer represents the average value of film thickness values at five points on the wafer surface (the center point of the wafer and four peripheral points which are located on a cross passing the wafer center point and spaced from the wafer edge by 5 mm). Before the fifth step (oxidation treatment step), the second to fourth steps do not contribute to the oxide film formation, and the oxide film is formed only in the first step.

In the embodiment described above, the parameters are not limited to the above values, and the same effect as the above embodiment can be obtained insofar as the conditions are set to the following ranges of (1) to (4).

(1) The flow rate of nitrogen gas serving as process gas when the wafers are inserted into the furnace tube is in the range of 1 to 100 [SLM], and the ratio of this process gas to the gas used to form the oxygen atmospheric layer 11 in the furnace tube port gas supply portion 16 is set to 1 or less in terms of flow rate in the furnace.

(2) The insertion speed of the wafer support boat 3 when the wafers 4 pass through the oxygen atmospheric layer 11 at the furnace tube port gas supply portion 16 is set to a fixed speed in the range of 10 to 500 mm/minute.

(3) The temperature of the furnace tube port gas supply portion 16 is set to a fixed value in the range of 500 to 900° C. with respect to the time in the insertion step. At this time, the temperature of the furnace tube port gas supply portion 16 may be controlled to a temperature different from that of the furnace tube process portion 14.

(4) Nitrogen gas for diluting oxygen gas used to form the oxygen atmospheric layer 11 at the furnace tube port gas supply portion 16 may be replaced by inert gas such as Ar gas, He gas, etc.

Any combination of these four conditions provides the same effect as this embodiment. However, the thickness of the oxide film which has been formed until the time just before the oxidation treatment step is varied with the combination of these conditions, and thus it is necessary to select a condition which provides a desired oxide film thickness.

[Second Embodiment]

Figure 6:
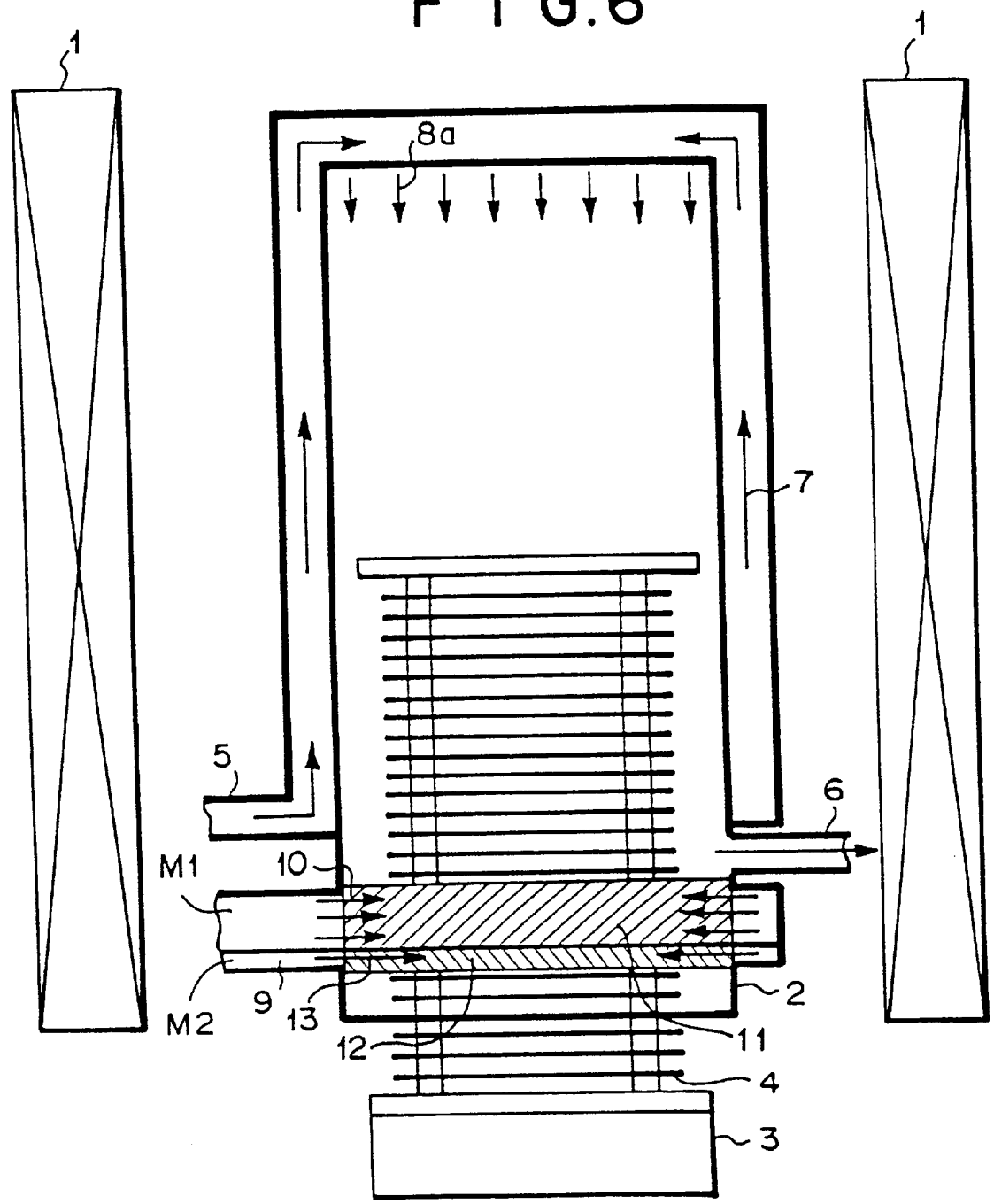
FIG. 6 is a longitudinal-sectional view showing a diffusion furnace according to a second embodiment of the present invention (during an insertion process of wafers)
Figure 7:
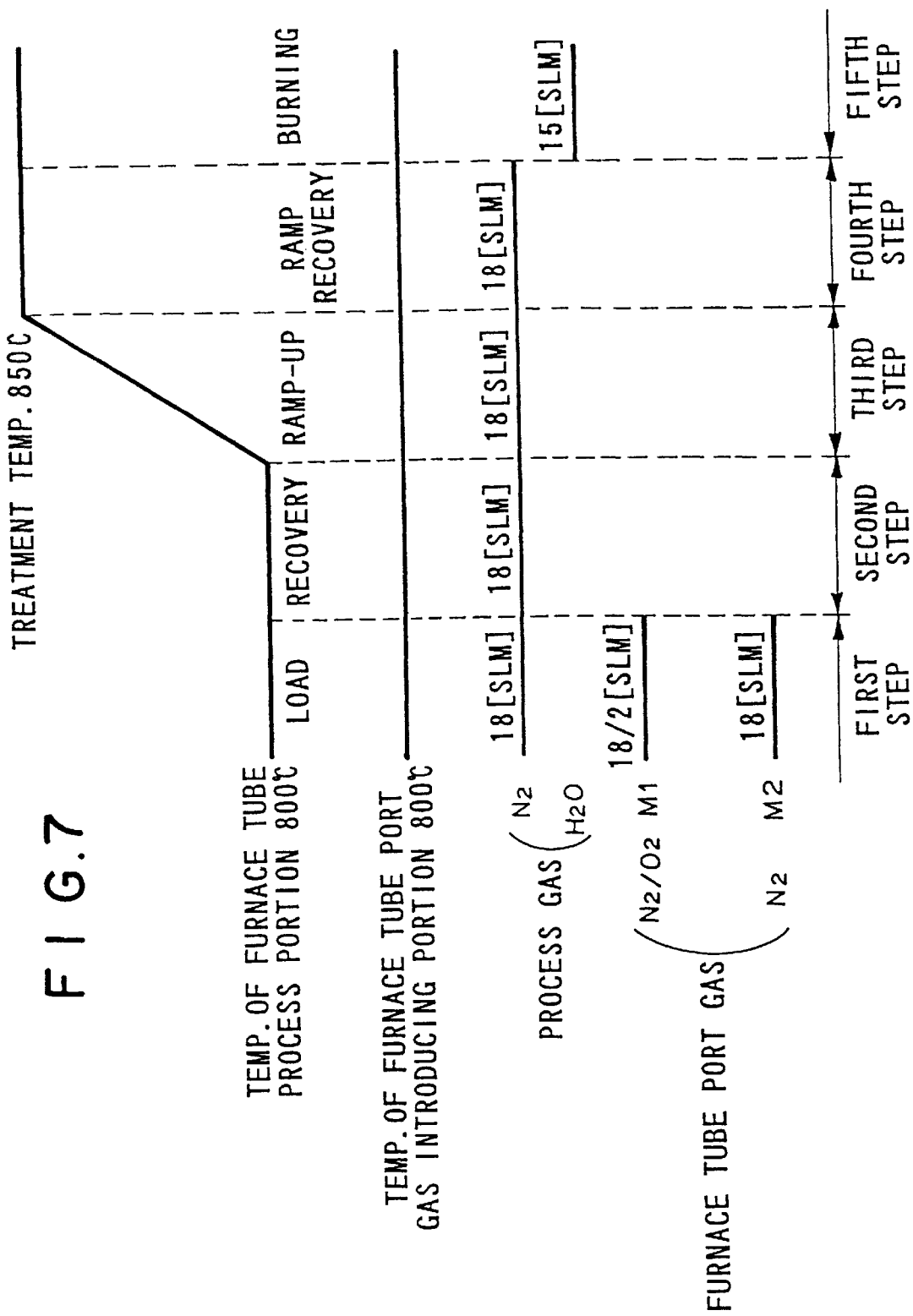
FIG. 7 is a sequence diagram showing an oxidation treatment in the diffusion furnace of the second embodiment of the present invention.

Next, a second embodiment according to the present invention will be described with reference to FIGS. 6 and 7. FIG. 6 is a longitudinal-sectional view showing a semiconductor device manufacturing apparatus according to the second embodiment of the present invention, and FIG. 7 is a diagram showing a temperature sequence of the second embodiment of the present invention.

Unlike the first embodiment, in the second embodiment, the furnace tube port gas introducing pipe 9 is separated into two parts (M1, M2) so that gas can be supplied independently through each of these two gas introducing pipes M1, M2. For example, the oxygen atmospheric layer 11 is formed by using the furnace tube port gas introducing pipe M1 adjacent to the furnace tube process portion 14, and the nitrogen gas atmospheric layer 12 is formed by using the furnace tube port gas introducing pipe M2 adjacent to the furnace tube lowermost portion. Here, the nitrogen gas supplied from M2 may be inert gas.

The treatment sequence of the second embodiment will be described with reference to FIG. 7. Unlike the first embodiment (FIG. 5), nitrogen gas is supplied via the pipe M2 when the wafer support boat 3 is inserted into the furnace tube. With this construction, when the wafers are inserted into the furnace tube, a nitrogen gas or inert gas atmospheric layer 12 is formed by using the furnace tube port gas introducing pipe M2, so that there is provided such an advantage that the oxygen drawing can be prevented.

[Third Embodiment]

Figure 8:
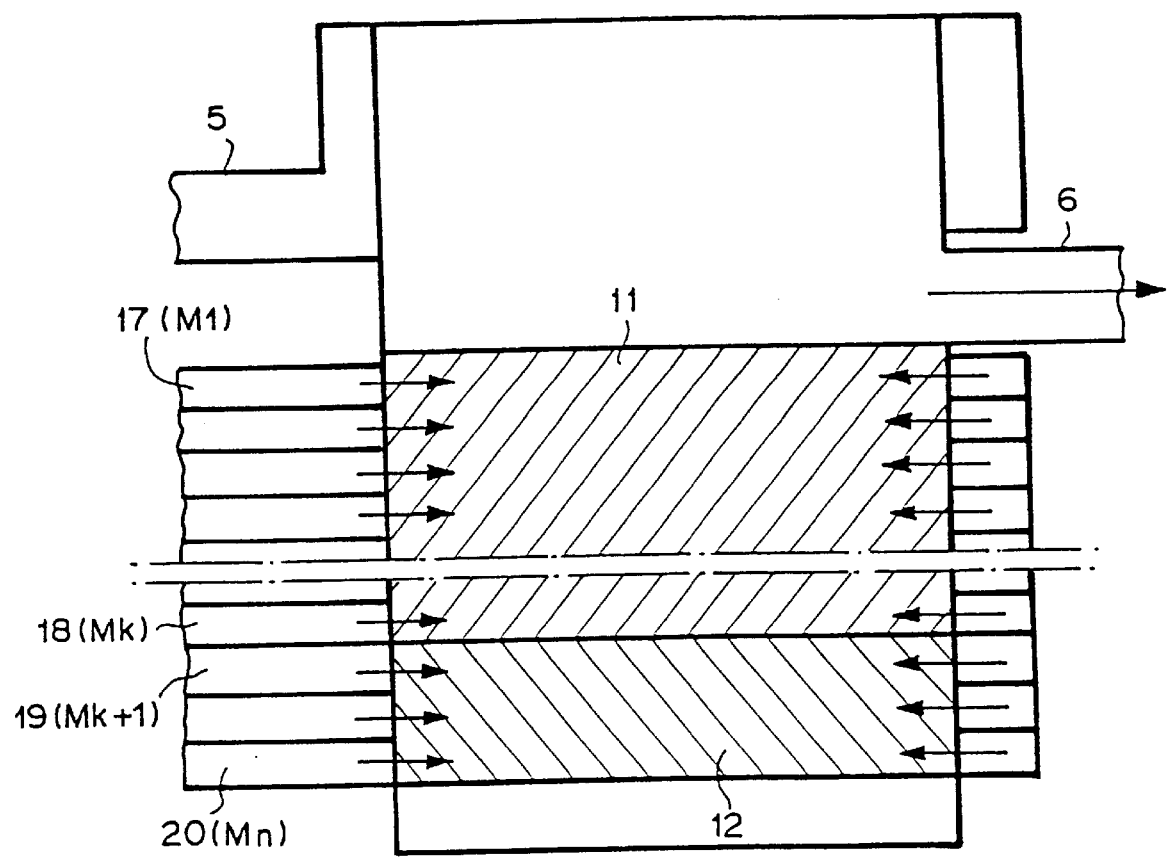
FIG. 8 is a longitudinal-sectional view showing a furnace tube port gas supply portion of a diffusion furnace according to a third embodiment of the present invention.

Next, a third embodiment according to the present invention will be described with reference to FIG. 8. FIG. 8 is a longitudinal-sectional view showing the third embodiment of the semiconductor device manufacturing apparatus of the present invention, and also is an enlarged view of the furnace tube port.

Referring to FIG. 8, according to the third embodiment, the structure of the furnace tube port gas supply portion of the first embodiment is further improved. Specifically, the furnace tube port gas supply portion is separated into parts of n (n—represents an integer equal to or greater than 3), and gas supply can be independently performed from each of furnace tube port gas introducing pipes M1 (17) to Mn (20). Here, a furnace tube port gas introducing pipe located nearest to the furnace tube process portion is represented by M1 (17) and a furnace tube port gas introducing pipe located at the lowermost portion is represented by Mn (20). The furnace tube port gas introducing pipes M1 (17) to Mk (k represents an integer less than n) (18) are used to form an oxygen atmospheric layer 11, and the furnace tube port gas introducing pipes Mk+1 (19) to Mn (20) are used to form a nitrogen gas or inert gas atmospheric layer 12.

By suitably selecting the lowermost portion Mk of the furnace tube port gas introducing pipes to form the oxygen atmospheric layer 11, the width (vertical dimension) of the oxygen atmospheric layer can be varied. Further, by varying the width of the oxygen atmospheric layer 11, the thickness of the oxide film formed when the wafers are inserted into the furnace tube can be controlled.

What is claimed is:

1. A method of manufacturing a semiconductor device, comprising the steps of:

inserting a semiconductor wafer into a furnace tube;

heating said furnace tube up to a temperature necessary for oxidation treatment of said semiconductor wafer and stabilizing the temperature; and oxidizing said semiconductor wafer in said furnace tube, wherein, in the step of inserting, anyone of inert gas and nitrogen gas is introduced into said furnace tube and oxidative gas is supplied to said semiconductor wafer at an insertion opening at one end of said furnace tube, anyone of inert gas and nitrogen gas is introduced into said furnace tube in the step of heating, and oxidative gas is introduced into said furnace tube in the step of oxidizing, anyone of inert gas and nitrogen gas being introduced into the other end of said furnace tube.

2. The method as claimed in claim 1, wherein said oxidative gas is water steam or a mixture of oxygen and nitrogen.

3. The method as claimed in claim 1, wherein said inserting of said semiconductor wafer is performed at a fixed speed.

4. The method as claimed in claim 1, wherein said oxidative gas supplied to said semiconductor wafer at said insertion opening of said furnace tube is supplied in a direction substantially perpendicular to a direction of insertion of said semiconductor wafer into said furnace tube, thereby forming a gas atmosphere having a layer boundary substantially perpendicular to said direction of insertion of said semiconductor wafer into said furnace tube.

5. A method of manufacturing a semiconductor device, comprising the steps of:

inserting a batch of plural semiconductor substrates into a furnace tube through an insertion port at one end of the furnace tube; and performing a treatment of the semiconductor substrates inserted into the furnace tube with reactive gas, wherein, in the step of inserting, gas containing at least the reactive gas is supplied to the semiconductor substrates at the insertion point of the furnace tube and anyone of inert gas and nitrogen gas is introduced into the furnace tube through an opening of the furnace tube which is located at the other end of the furnace tube, and wherein the treatment is oxidizing treatment and the reactive gas is oxidative gas.

6. The method as claimed in claim 5, wherein the batch is inserted into the furnace tube at a fixed speed.

7. The method as claimed in claim 5, wherein the gas containing at least the reactive gas is supplied to the semiconductor substrates in a direction substantially perpendicular to an insertion direction of the batch in the step of inserting.

* * * * *